United States Patent
Chih et al.

(10) Patent No.: US 7,688,087 B2
(45) Date of Patent: Mar. 30, 2010

(54) TEST APPARATUS

(75) Inventors: Chen-Chien Chih, Hsin-Chu (TW);
Chun-Chen Liao, Hsin-Chu (TW)

(73) Assignee: King Yuan Electronics Co., Ltd., Hsin-Chu (TW)

( * ) Notice: Subject to any disclaimer, the term of this patent is extended or adjusted under 35 U.S.C. 154(b) by 109 days.

(21) Appl. No.: 11/979,511

(22) Filed: Nov. 5, 2007

(65) Prior Publication Data

US 2008/0284454 A1    Nov. 20, 2008

(30) Foreign Application Priority Data

May 18, 2007    (TW) ............................... 96117692 A

(51) Int. Cl.
*G01R 31/26*    (2006.01)
*G01R 1/06*    (2006.01)
(52) U.S. Cl. .................... 324/754; 324/158.1
(58) Field of Classification Search ........... None
See application file for complete search history.

(56) References Cited

U.S. PATENT DOCUMENTS

| | | | | | |
|---|---|---|---|---|---|
| 4,806,852 | A | * | 2/1989 | Swan et al. | 324/73.1 |
| 5,095,483 | A | * | 3/1992 | Dubler et al. | 714/736 |
| 5,909,186 | A | * | 6/1999 | Gohringer | 341/120 |
| 6,005,408 | A | * | 12/1999 | Gillette | 324/765 |
| 6,486,691 | B2 | * | 11/2002 | Tsujii | 324/765 |
| 6,687,868 | B1 | * | 2/2004 | Furukawa et al. | 714/740 |
| 6,714,888 | B2 | * | 3/2004 | Mori et al. | 702/120 |

* cited by examiner

*Primary Examiner*—Vinh P Nguyen
(74) *Attorney, Agent, or Firm*—Ming Chow; Sinorica, LLC

(57) ABSTRACT

An under testing device interface with mixed-signal processing circuit is disclosed. The under testing device interface with mixed signal processing circuit software of integrates the mixed-signal processing circuit into the probe card or device under testing card, the mixed-signal processing circuit with the pin electric channel of the tester, and the programs for handling the process of mixed-signal processing circuit into the system software of the tester.

7 Claims, 3 Drawing Sheets

TEST APPARATUS

FIELD OF THE INVENTION

The present invention relates to a tester for a semiconductor device, and more particularly to a tester for integrating a mixed signal processing circuit into a probe card or a device under test card.

DESCRIPTION OF THE RELATED ART

Semiconductor testing apparatus can be a logic circuit test apparatus, a memory circuit test apparatus, or a hybrid circuit test apparatus according to electrical functions of semiconductor devices. The main function of the tester is for sending the electrical signal to a device under test (DUT) and receiving the output signal from the DUT, wherein the tester of the hybrid test apparatus includes both the logic signal and analog signal generation circuits.

In the current testing apparatus of the mixed signal circuit, the mixed signal chip under test is disposed on the probe card or DUT card, and the mixed signal for testing the mixed signal chip is generated from the mixed-signal module of the tester and is conducted to the mixed signal chip under test disposed on the probe card or DUT card via the trace lines. Besides, for the purpose of testing a variety of chips, the mixed-signal module is provided in the tester for operatively testing the device under test.

Referring to FIG. 1, a mixed signal module under test 12 comprises a clock pulse generation circuit 122, a logical signal generation circuit 124 and a mixed signal generation circuit 126, and the mixed signal generation circuit 126 generates a mixed signal based on a clock pulse signal generated from the clock pulse generation circuit 122. Besides, a test interface 14 of a DUT is provided in the tester 10 as a signal transmission interface between the tester and the DUT, and the test interface 14 of the DUT can be a probe card or a DUT card, and a connector 16 is disposed on the probe card or the DUT card for electrically connecting to a chip 15. Besides, digital and analog signals are transmitted via a plurality of metal wires 11 among the clock pulse generation circuit 122, the logical signal generation circuit 124 and the mixed signal generation circuit 126. Besides, the digital and analog signals are transmitted for testing via pin electronic channels 13 disposed on the test interface 14 of the DUT among the clock pulse generation circuit 122, the logical signal generation circuit 124, the mixed signal generation circuit 126 and the test interface 14 of the DUT, and then a mixed signal transmitted from the chip 15 is converted to a digital signal and the digital signal is transmitted to a test apparatus 10. The test apparatus 10 may determine the test result based on the digital signal.

The digital and analog signals of the test apparatus is controlled by a test program provided in a tester. Such a design may result in signal attenuation or noise increased so that it fails to obtain the correct test result probably because the metal wires 11 between the test interface 14 of the DUT and the mixed signal generation circuit 126 is too long. Such a problem will be deteriorated especially in the case of testing the high speed chip.

SUMMARY OF THE INVENTION

Accordingly, it is a principal object of the present invention to integrate a mixed signal generation circuit into a test interface of the device under test (DUT) so that the distance between the DUT and the mixed signal generation circuit is decreased to reduce the noise and enhance the strength of the analog signal.

It is another principal object of the present invention to integrate a mixed signal generation circuit into a test interface of the DUT and thus the mixed signal generation circuit disposed on the test interface of the DUT can arbitrarily be replaced by any kind of digital-analog converting circuit or analog-digital converting circuit such that it is not necessary to replace the test device and thus the mixed signal chip under test can arbitrarily be upgraded in an inexpensive cost so as to efficiently reduce the overall test cost.

To achieve the above mentioned objects, the present invention is to provide a test interface of a test apparatus for testing a mixed signal semiconductor device, wherein the test interface comprises: an electronic connection device, a plurality of mixed signal generation circuits disposed on the test interface and a plurality of pin electronic channels disposed on the test interface for electrically connecting the electronic connection devices with the plurality of mixed signal generation circuits.

The present invention is to provide a test apparatus which comprises a tester and a test interface, wherein the test interface comprises: an electronic connection device, a plurality of mixed signal generation circuits disposed on the test interface and a plurality of pin electronic channels disposed on the test interface for electrically connecting the electronic connection devices with the plurality of mixed signal generation circuits.

DETAILED DESCRIPTION OF THE INVENTION

The present invention is to disclose a tester interface integrated to a mixed signal processing circuit. In order to thoroughly understand the present invention, the following description will be provided for details of steps and constructions. Obviously, the present invention is not limited to the basic principles or techniques of a test interface integrated to the mixed signal processing circuit which are well-known by those skilled in the art, and thus the following description will omit the description of the principles. Moreover, the diagrams included in the present invention are not completely drawn according to the real size and are only used for demonstration and explanation.

Figure 1:
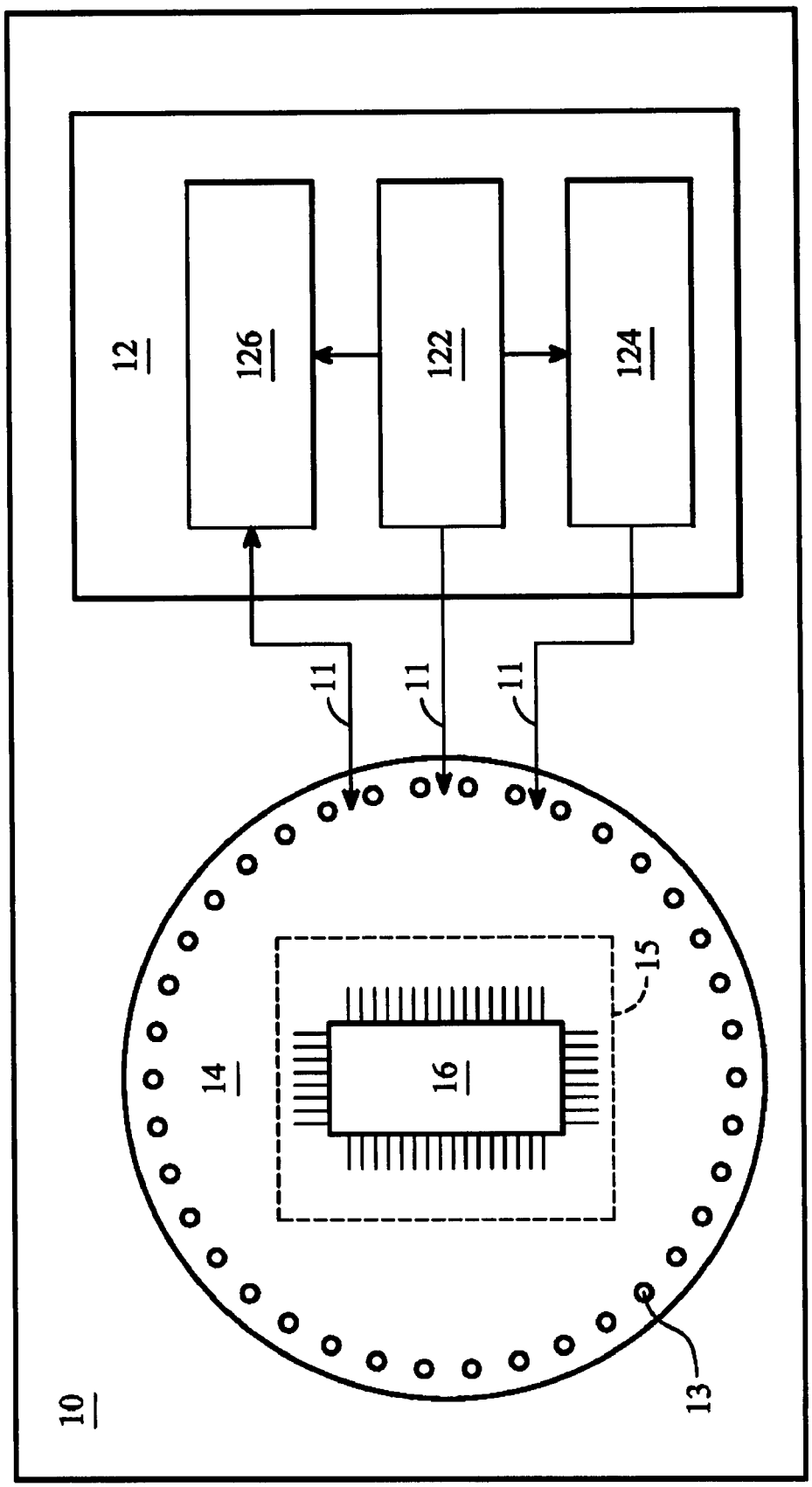
FIG. 1 is schematic diagrams illustrating conventional mixed signal module.
Figure 2:
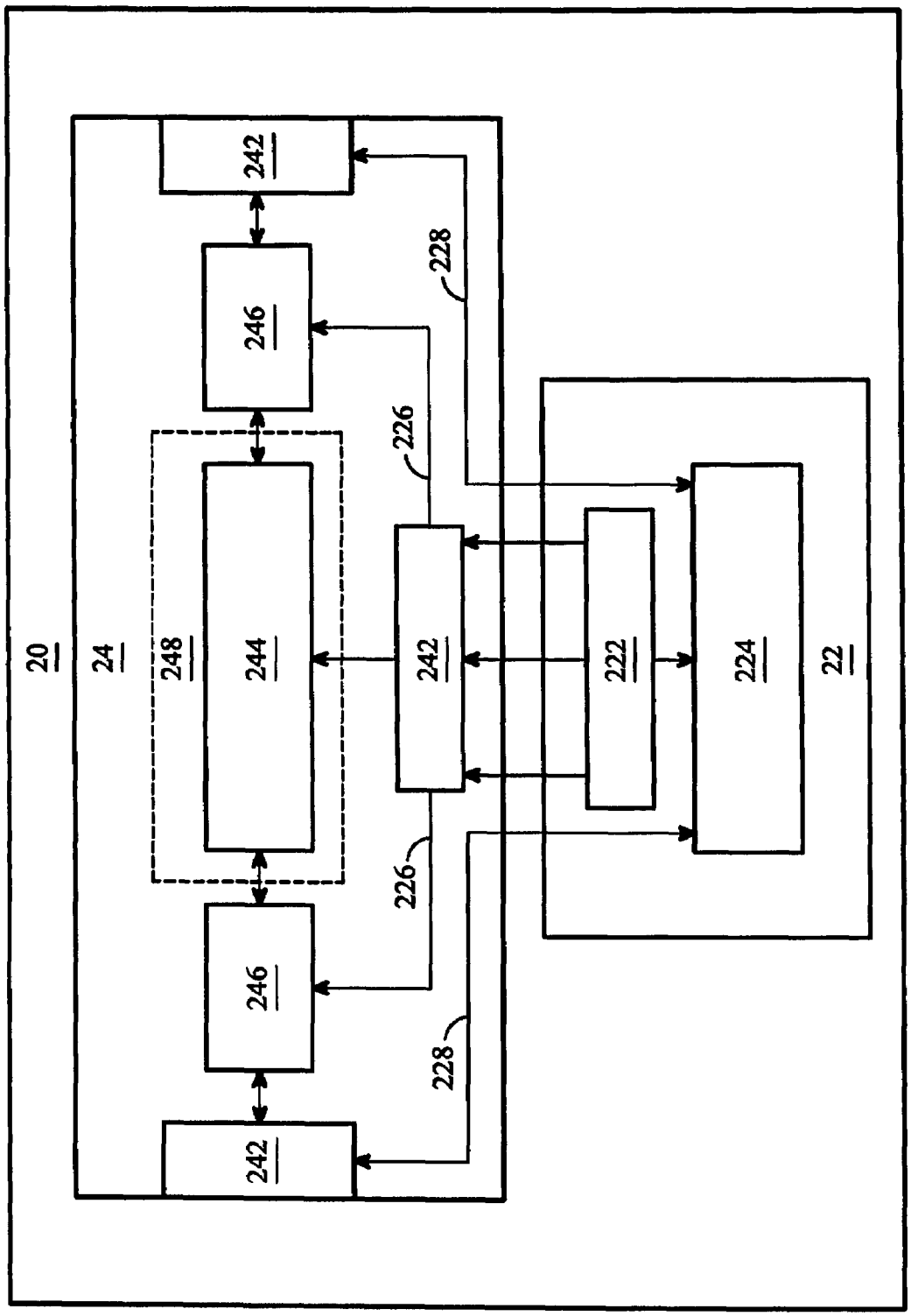
FIG. 2 and FIG. 3 are schematic diagrams illustrating test apparatuses of the present invention, respectively.

Referring to FIG. 2, a test apparatus 20 at least includes a tester 22 and a test interface 24 of a device under test (DUT). The tester 22 at least includes a clock pulse generation circuit 222 and a logical signal generation circuit 224; and the test interface 24 includes a plurality of pin electronic channels 242, an electronic connection device 244 and a plurality of mixed signal generation circuits 246, wherein the tester 22 is connected to the test interface 24 through a plurality of metal wires. In this embodiment, the test interface 24 can be a probe card or a DUT card, and the mixed signal generation circuit 246 can be an analog-digital converting circuit or a digital-analog converting circuit or any combination thereof. When the test interface 24 is a DUT card, the electronic connection device 244 thereon can be a socket composed of one or a plurality of DUTs for electrically connecting a packaged chip. When the test interface 24 is a probe card, the electronic connection device 244 thereon can be a prober with probes which are used to test one or more than one regions on a wafer.

Referring back to FIG. 2, when a DUT 248 is provided in the electronic connection device 244 (i.e. one or several sockets), the tester 22 enables the clock pulse generation circuit 222 and the logical signal generation circuit 224 based on the test program, and the clock pulse signal 226 is transmitted to the logical signal generation circuit 224 and the pin electronic channels 242 of the test interface 24 and then transmitted to the electronic connection device 244 and the mixed signal generation circuits 246 therefrom so that each element in the test apparatus can be synchronized. The digital signal 228 generated from the logical signal generation circuit 224 is transmitted to the mixed signal generation circuits 246 through the pin electronic channels 242 so that the digital signal received by the mixed signal generation circuits 246 is converted to an analog signal and then transmitted to the DUT 248 disposed on the electronic connection device 244; meanwhile, the mixed signal generation circuits 246 converts the analog signal, which is outputted from the DUT 248, to a digital signal and the digital signal is sent back to the tester 22 via the pin electronic channels 242. The test program of the tester 22 controls transmission and conversion of these signals.

Obviously, in the present embodiment, the mixed signal generation circuits 246 as required by the DUT 248 has been integrated to the test interface 24. Thus, the tester 22 just needs the clock pulse generation circuit 222 and the logical signal generation circuit 224 conforming to standards, and the DUT 248 can be tested under the control of the test program. Such a configuration will make the mixed signal generated by the mixed signal generation circuits 246 be transmitted to the DUT 248 in a shortest path so that it can avoid the signal attenuation and increased noise, and thus the present invention can perform higher speed test of the DUT 248. Meanwhile, the mixed signal generation circuits 246 disposed on the test interface 24 can also be arbitrarily replaced by any kind of digital-analog converting circuit or analog-digital converting circuit such that it is not necessary to replace the test device and thus the DUT 248 can arbitrarily be upgraded in an inexpensive cost so as to efficiently reduce the overall test cost.

On the other hand, since the mixed signal generation circuits 246 is integrated into the test interface 24, the tester 22 is dedicated to provide the digital signal 228 during test and the circuit in the tester 22 does not need to be replaced so frequently even if the DUT 248 has a different type. Therefore, the tester of the present invention is to supply the required clock pulse signal 226 and digital signal 228 for performing the test of different types of the DUT 248 under the control of different test programs so as to reduce the setup time of the test apparatus. Besides, the test interface 24 of the present invention can be provided with a plurality of test sockets 244 so that the overall throughput is enhanced when the test program can be configured to perform test of several DUTs simultaneously.

Figure 3:
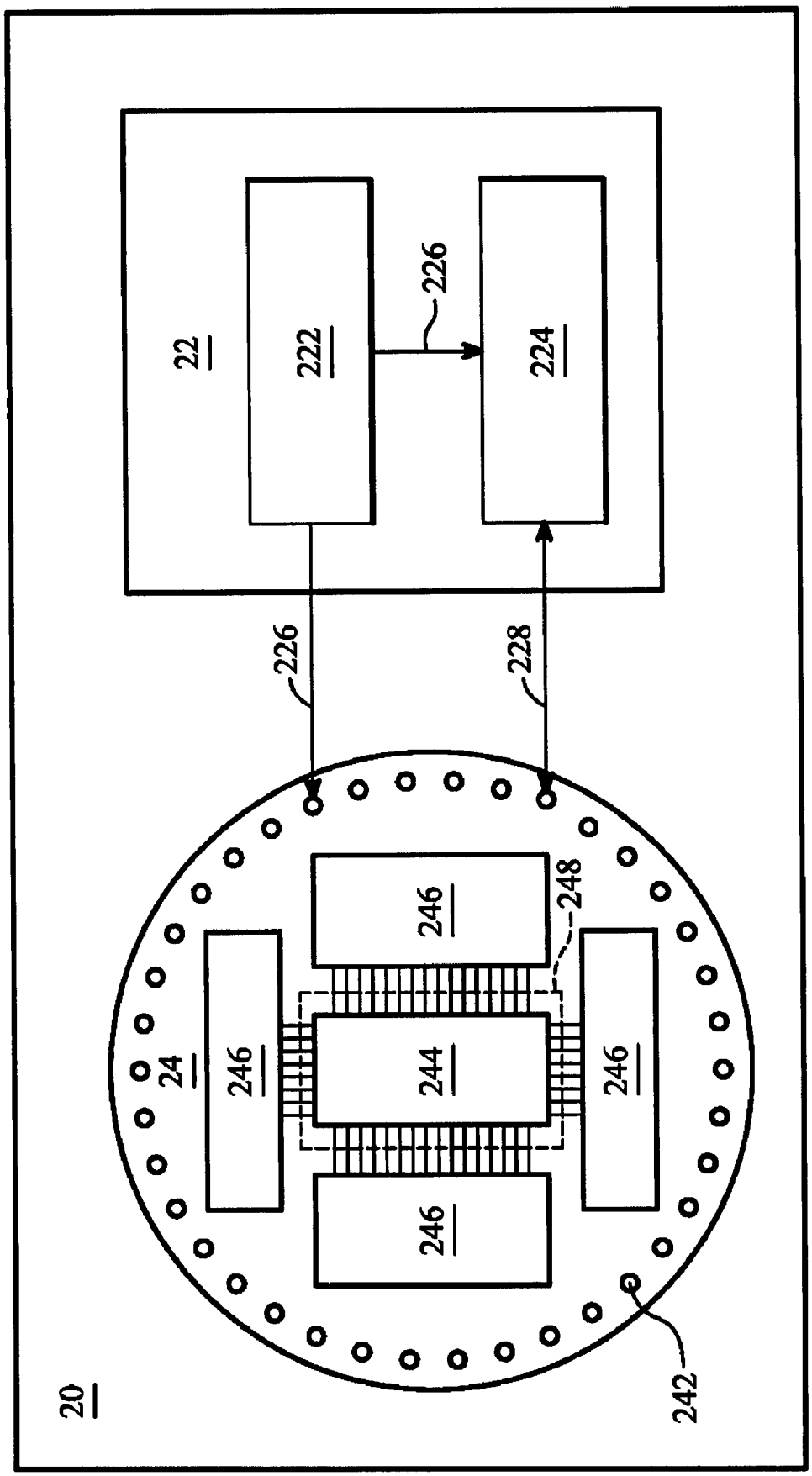

Next, referring to FIG. 3, a test apparatus having a probe card of the present invention provided with a mixed signal generation circuit is depicted. As shown in FIG. 3, obviously, the test interface 24 in the present embodiment can be replaced by a probe card; meanwhile, the electronic connection device 244 can be replaced by a prober having probes. When a DUT 248 (e.g. wafer) is disposed on the test apparatus 20, the tester 22 starts the clock pulse generation circuit 222 and the logical signal generation circuit 224 according to the test program, and the clock pulse signal 226 is transmitted to the logical signal generation circuit 224 and the pin electronic channels 242 of the test interface 24 and then transmitted to the prober 244 and the mixed signal generation circuits 246 from the pin electronic channels 242 so that each element in the test apparatus 20 can be synchronized. The digital signal 228 generated from the logical signal generation circuit 224 is transmitted to the mixed signal generation circuits 246 through the pin electronic channels 242. Through the control of the test program, the digital signal received by a part of the mixed signal generation circuits 246 is converted to an analog signal and then the prober 244 is driven to enable the probes thereof to test one region or more than one regions on the wafer. Meanwhile, a part of the mixed signal generation circuits 246 can also convert the analog signal, which is sent from the DUT 248, to a digital signal and the digital signal is sent back to the tester 22 via the pin electronic channels 242. The test program of the tester 22 controls transmission and conversion of these signals.

Through the above mentioned description, the mixed signal generation circuits 246 of the present invention disposed on the probe card can be regarded as an integrated analog-digital converting circuit which performs conversion and transmission of the digital and analog signals under the control of the test program. Meanwhile, analog-digital converting circuit can arbitrarily be replaced with any kind of digital-analog converting circuit or analog-digital converting circuit so as to perform the test of the high-level or high-speed level mixed signal in an inexpensive cost.

The above mentioned preferred embodiments of the present invention are not meant to limit the scope of the present invention. The description of the present invention should be understood by those skilled in the art. Moreover, any changes or modifications or the equivalent thereof that can be made without departing from spirit of the present invention should be protected by the following claims.

What is claimed is:

1. A test apparatus comprising a tester and a test interface, the tester provided with at least a logical signal generation circuit and at least a clock pulse signal generation circuit, the logical signals and clock pulse signals being connected with the plurality of pin electronic channels through a plurality of metal wires, the characterized in that the test interface comprises:

at least an electronic connection device, each of which is for electrically connecting to a device under test (DUT);

a plurality of mixed signal generation circuits disposed on the test interface; and a plurality of pin electronic channels is disposed on the test interface for electrically connecting each of electronic connection devices with the plurality of mixed signal generation circuits, wherein said clock pulse signal is generated from a clock pulse generation circuit based on a test program and at least said logical signal generation circuit and at least said clock pulse generation circuit are electrically connected with said plurality of pin electronic channels via the plurality of mixed signal generation circuits.

2. The test interface of claim 1, wherein the test interface is a DUT card.

3. The test interface of claim 1, wherein the test interface is a probe card.

4. The test interface of claim 1, wherein the mixed signal generation circuit is selected from one of a digital-analog converting circuit or an analog-digital converting circuit.

5. The test interface of claim 2, wherein the electronic connection device is a socket when the test interface is a DUT card.

6. The test interface of claim 2, wherein the DUT is a packaged chip when the test interface is a DUT card.

7. The test interface of claim 1, wherein the tester further comprises a test program for executing and controlling a test procedure.

* * * * *